(12) United States Patent
Liu

(10) Patent No.: US 9,761,510 B2
(45) Date of Patent: Sep. 12, 2017

(54) CHIP PACKAGE AND METHOD FOR FORMING THE SAME

(71) Applicant: XINTEC INC., Taoyuan (TW)

(72) Inventor: Chien-Hung Liu, New Taipei (TW)

(73) Assignee: XINTEC INC., Taoyuan (TW)

( * ) Notice: Subject to any disclaimer, the term of this patent is extended or adjusted under 35 U.S.C. 154(b) by 48 days.

(21) Appl. No.: 14/706,896

(22) Filed: May 7, 2015

(65) Prior Publication Data

US 2015/0325552 A1 Nov. 12, 2015

(30) Foreign Application Priority Data

May 9, 2014 (TW) .............................. 103116484 A
Aug. 8, 2014 (TW) .............................. 103127225 A

(51) Int. Cl.
*H01L 23/488* (2006.01)
*H01L 25/065* (2006.01)
(Continued)

(52) U.S. Cl.
CPC ............ *H01L 23/488* (2013.01); *H01L 21/56* (2013.01); *H01L 23/3114* (2013.01); *H01L 23/3128* (2013.01); *H01L 23/5389* (2013.01); *H01L 24/11* (2013.01); *H01L 24/14* (2013.01); *H01L 24/19* (2013.01); *H01L 24/24* (2013.01); *H01L 24/49* (2013.01); *H01L 24/82* (2013.01); *H01L 24/94* (2013.01); *H01L 24/97* (2013.01); *H01L 25/0657* (2013.01); *H01L 25/50* (2013.01);
(Continued)

(58) Field of Classification Search
CPC . H01L 25/0657; H01L 23/3128; H01L 24/11; H01L 24/14; H01L 24/49; H01L 2224/0231; H01L 2224/12105; H01L 2224/13024; H01L 224/1403; H01L 2224/14505; H01L 2224/48106; H01L 2224/4149; H01L 2224/48451; H01L 2225/06506; H01L 2225/06568
See application file for complete search history.

(56) References Cited

U.S. PATENT DOCUMENTS

2005/0046002 A1 3/2005 Lee et al.
2007/0273049 A1* 11/2007 Khan ...................... H01L 21/56
257/787
(Continued)

FOREIGN PATENT DOCUMENTS

CN 101083243 A 12/2007
CN 102931102 A 2/2013
(Continued)

*Primary Examiner* — Daniel Luke
*Assistant Examiner* — Khatib Rahman
(74) *Attorney, Agent, or Firm* — Liu & Liu

(57) ABSTRACT

A chip package including a first device substrate is provided. The first device substrate is attached to a first surface of a second device substrate. A third device substrate is attached to a second surface of the second device substrate opposite to the first surface. An insulating layer covers the first, second and third device substrates and has at least one opening therein. At least one bump is disposed under a bottom of the opening. A redistribution layer is disposed on the insulating layer and electrically connected to the bump through the opening. A method for forming the chip package is also provided.

35 Claims, 9 Drawing Sheets

(51) Int. Cl.
*H01L 25/00* (2006.01)
*H01L 23/00* (2006.01)
*H01L 23/31* (2006.01)
*H01L 21/56* (2006.01)
*H01L 23/538* (2006.01)

(52) U.S. Cl.
CPC .............. *H01L 24/05* (2013.01); *H01L 24/29* (2013.01); *H01L 24/32* (2013.01); *H01L 24/45* (2013.01); *H01L 24/48* (2013.01); *H01L 24/73* (2013.01); *H01L 24/92* (2013.01); *H01L 2224/0231* (2013.01); *H01L 2224/04042* (2013.01); *H01L 2224/04105* (2013.01); *H01L 2224/05573* (2013.01); *H01L 2224/05575* (2013.01); *H01L 2224/12105* (2013.01); *H01L 2224/13017* (2013.01); *H01L 2224/13024* (2013.01); *H01L 2224/1403* (2013.01); *H01L 2224/14505* (2013.01); *H01L 2224/24146* (2013.01); *H01L 2224/2919* (2013.01); *H01L 2224/32145* (2013.01); *H01L 2224/45144* (2013.01); *H01L 2224/48091* (2013.01); *H01L 2224/48106* (2013.01); *H01L 2224/48145* (2013.01); *H01L 2224/48149* (2013.01); *H01L 2224/48227* (2013.01); *H01L 2224/48451* (2013.01); *H01L 2224/48464* (2013.01); *H01L 2224/73227* (2013.01); *H01L 2224/73265* (2013.01); *H01L 2224/73267* (2013.01); *H01L 2224/82031* (2013.01); *H01L 2224/82039* (2013.01); *H01L 2224/92164* (2013.01); *H01L 2224/92244* (2013.01); *H01L 2224/92247* (2013.01); *H01L 2224/94* (2013.01); *H01L 2224/97* (2013.01); *H01L 2225/0651* (2013.01); *H01L 2225/06548* (2013.01); *H01L 2225/06568* (2013.01); *H01L 2924/10253* (2013.01); *H01L 2924/141* (2013.01); *H01L 2924/143* (2013.01); *H01L 2924/181* (2013.01)

(56) References Cited

U.S. PATENT DOCUMENTS

| | | | |
|---|---|---|---|
| 2009/0134528 A1* | 5/2009 | Lee | H01L 21/486 257/777 |
| 2009/0166840 A1 | 7/2009 | Kang et al. | |
| 2009/0250822 A1 | 10/2009 | Chen et al. | |
| 2009/0251862 A1 | 10/2009 | Knickerbocker et al. | |
| 2009/0261466 A1* | 10/2009 | Pagaila | H01L 21/6835 257/686 |
| 2012/0280386 A1* | 11/2012 | Sato | H01L 23/3121 257/737 |

FOREIGN PATENT DOCUMENTS

| | | |
|---|---|---|
| TW | 201216427 | 4/2012 |
| TW | 201240064 | 10/2012 |
| TW | 201320259 | 5/2013 |

* cited by examiner

CHIP PACKAGE AND METHOD FOR FORMING THE SAME

CROSS REFERENCE TO RELATED APPLICATIONS

This application is based on, and claims priority of Taiwan Patent Application No. 103116484, filed on May 9, 2014, and priority of Taiwan Patent Application No. 103127225, filed on Aug. 8, 2014, the entirety of which is incorporated by reference herein.

BACKGROUND OF THE INVENTION

Field of the Invention

The invention relates to chip package technology, and in particular to a chip package and methods for forming the same.

Description of the Related Art

The chip packaging process is an important step in the fabrication of an electronic product. Chip packages not only protect the chips therein from outer environmental contaminants, but they also provide electrical connection paths between electronic elements inside and those outside of the chip packages.

In general, chip packages and other integrated circuit chips are separately and independently disposed on a printed circuit board and are electrically connected to each other through wires.

However, the size of the printed circuit board is limited in this fabrication process. As a result, it is difficult to further decrease the size of the electronic products made therefrom.

Thus, there exists a need in the art for development of a chip package and methods for forming the same capable of mitigating or eliminating the aforementioned problems.

BRIEF SUMMARY OF THE INVENTION

An embodiment of the invention provides a chip package comprising a first device substrate. The first device substrate is attached to a first surface of a second device substrate. A third device substrate is attached to a second surface of the second device substrate opposite to the first surface. An insulating layer covers the first, second and third device substrates and has at least one opening therein. At least one first bump is disposed under a bottom of the opening. A redistribution layer is disposed on the insulating layer and electrically connected to the first bump through the opening.

An embodiment of the invention provides a method for forming a chip package comprising attaching a first device substrate to a first surface of a second device substrate. A third device substrate is attached to a second surface of the second device substrate opposite to the first surface. At least one first bump and an insulating layer are formed. The insulating layer covers the first, second and third device substrates and has at least one opening therein, such that the first bump is formed under the bottom of the opening. A redistribution layer is formed on the insulating layer and electrically connected to the first bump through the opening.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The making and using of the embodiments of the present disclosure are discussed in detail below. However, it should be noted that the embodiments provide many applicable inventive concepts that can be embodied in a variety of specific methods. The specific embodiments discussed are merely illustrative of specific methods to make and use the embodiments, and do not limit the scope of the disclosure. The disclosed contents of the present disclosure include all the embodiments derived from claims of the present disclosure by those skilled in the art. In addition, the present disclosure may repeat reference numbers and/or letters in the various embodiments. This repetition is for the purpose of simplicity and clarity, and does not imply any relationship between the different embodiments and/or configurations discussed. Furthermore, when a first layer is referred to as being on or overlying a second layer, the first layer may be in direct contact with the second layer, or spaced apart from the second layer by one or more material layers.

A chip package according to an embodiment of the present invention may be used to package micro-electro-mechanical system chips. However, embodiments of the invention are not limited thereto. For example, the chip package of the embodiments of the invention may be implemented to package active or passive devices or electronic components of integrated circuits, such as digital or analog circuits. For example, the chip package is related to optoelectronic devices, micro-electro-mechanical systems (MEMS), biometric devices, microfluidic systems, and physical sensors measuring changes to physical quantities such as heat, light, capacitance, pressure, and so on. In particular, a wafer-level package (WSP) process may optionally be used to package semiconductor chips, such as image-sensor elements, light-emitting diodes (LEDs), solar cells, RF circuits, accelerators, gyroscopes, fingerprint recognition devices, microactuators, surface acoustic wave devices, pressure sensors, ink printer heads, and so on.

The above-mentioned wafer-level packaging process mainly means that after the packaging step is accomplished during the wafer stage, the wafer with chips is cut to obtain individual packages. However, in a specific embodiment, separated semiconductor chips may be redistributed on a carrier wafer and then packaged, which may also be referred to as a wafer-level packaging process. In addition, the above-mentioned wafer-level packaging process may also be adapted to form a chip package having multi-layer integrated circuit devices by stacking a plurality of wafers having integrated circuits.

Figure 1A:
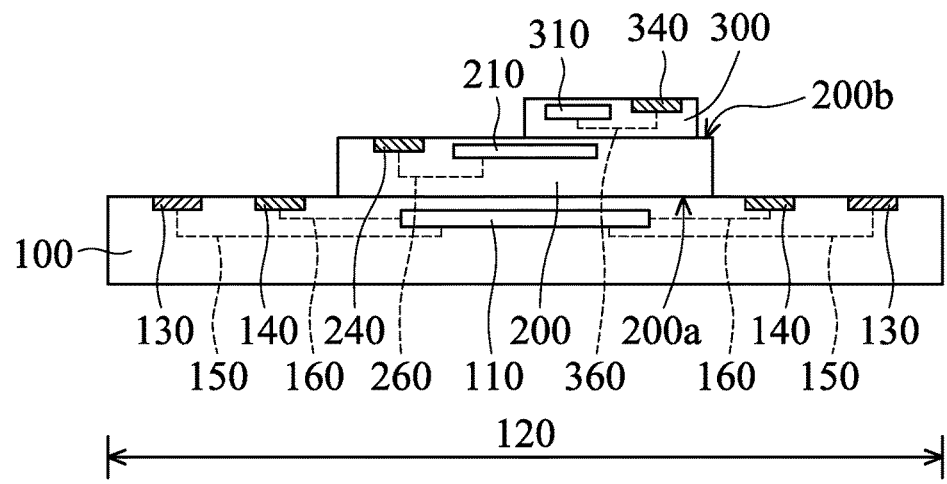
FIGS. 1A to 1E are cross-sectional views of an exemplary embodiment of a method for forming a chip package according to the invention.
Figure 1B:
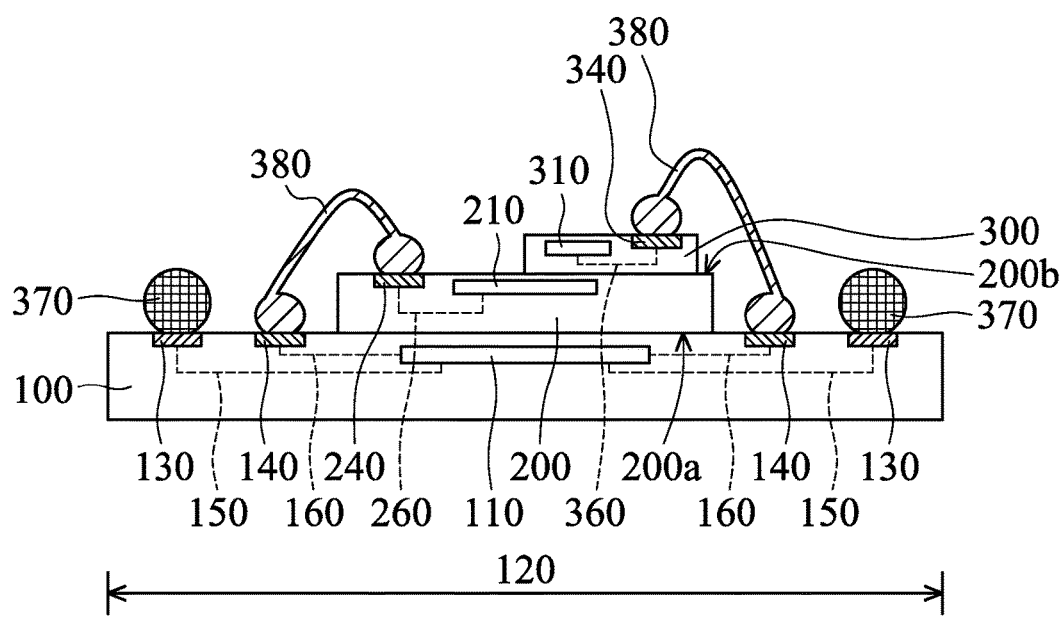
Figure 1C:
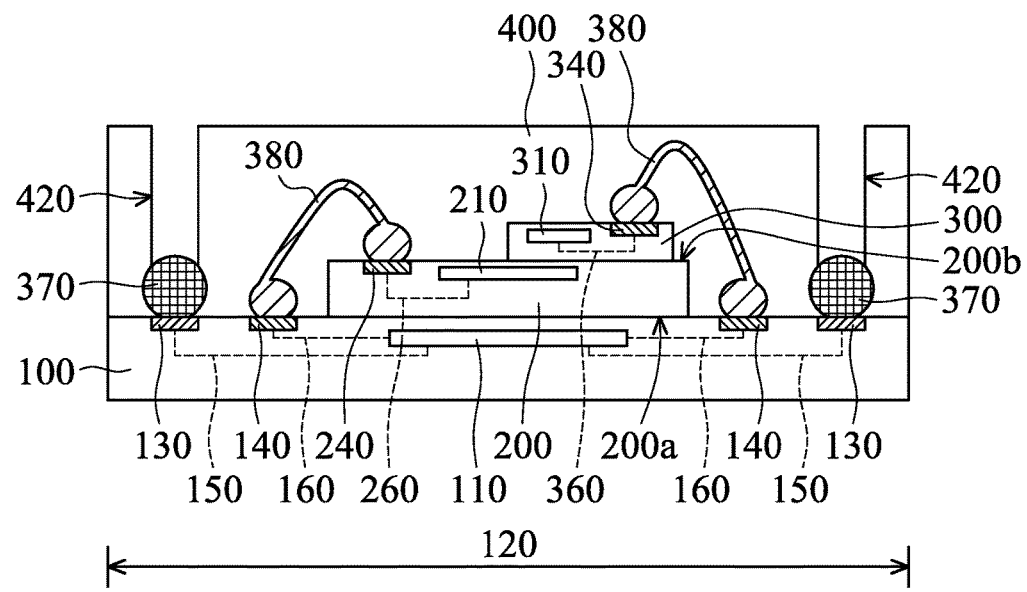
Figure 1D:
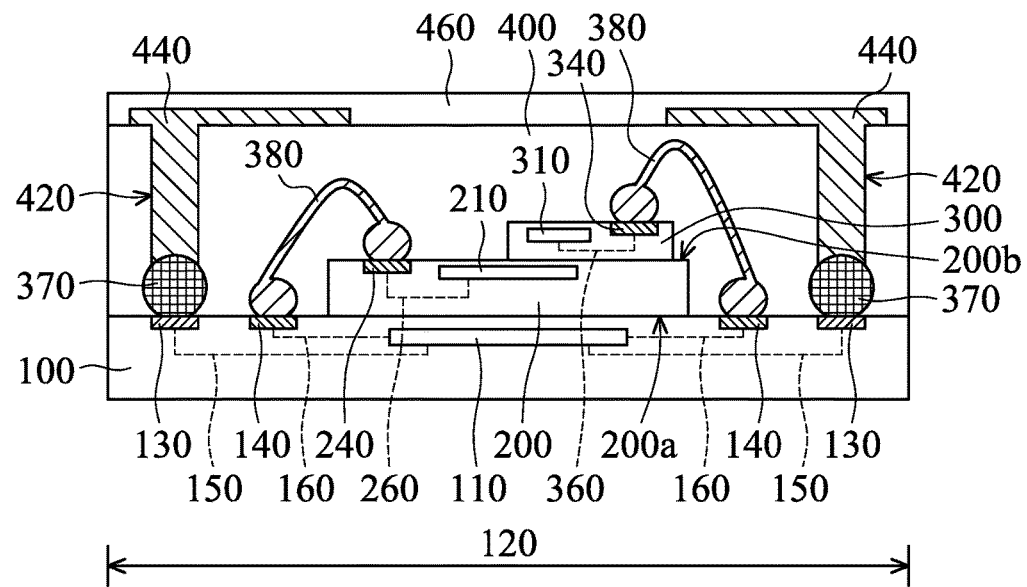
Figure 1E:
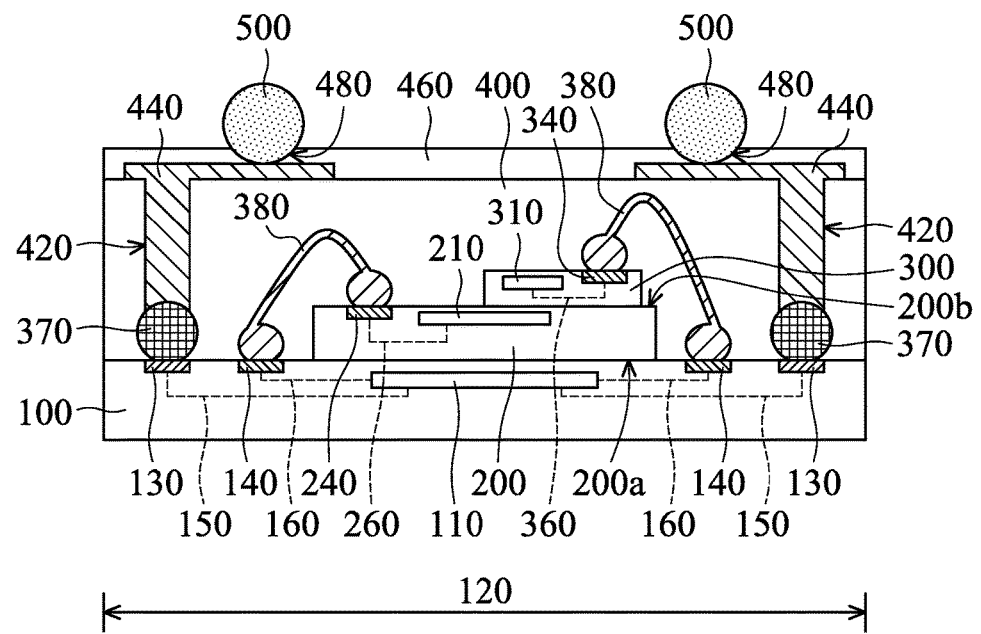

A cross-sectional view of an exemplary embodiment of a chip package according to the invention is illustrated in FIG. 1E. In the embodiment, the chip package comprises a first device substrate 100, a second device substrate 200, a third device substrate 300, an insulating layer 400, a plurality of first bumps 370 and a patterned redistribution layer 440. In one embodiment, the first device substrate 100 may be a silicon substrate or another semiconductor substrate. In the embodiment, the first device substrate 100 comprises one or more first bonding pads 130 and one or more first conducting pads 140. The first bonding pad 130 and the first conducting pad 140 may be adjacent to an upper surface of the first device substrate 100. In the embodiment, the first bonding pad 130 and the first conducting pad 140 may be a single conducting layer or comprise multiple conducting layers. To simplify the diagram, only two first bonding pads 130 comprising a single conducting layer and two first conducting pads 140 comprising a single conducting layer in the first device substrate 100 are depicted herein as an example.

In the embodiment, the first device substrate 100 may be a chip comprising a device region 110 and an electronic element (not shown) in the device region 110. In one embodiment, the electronic element in the device region 110 may be electrically connected to the first bonding pads 130 and the first conducting pads 140 by interconnection structures in the first device substrate 100. To simplify the diagram, only dotted lines 150 and 160 are depicted herein to respectively represent interconnection structures between the first bonding pad 130 and the device region 110 and between the first conducting pad 140 and the device region 110.

The second device substrate 200 has a first surface 200a and a second surface 200b opposite thereto. The first surface 200a of the second device substrate 200 may be attached to the upper surface of the first device substrate 100 by an adhesive layer (not shown). In one embodiment, the second device substrate 200 may be a silicon substrate or another semiconductor substrate. In the embodiment, the second device substrate 200 comprises one or more second conducting pads 240. The second conducting pads 240 may be adjacent to the second surface 200b. Moreover, the second conducting pads 240 may have a similar structure to that of the first conducting pads 140. To simplify the diagram, only one second conducting pad 240 comprising a single conducting layer in the second device substrate 200 is depicted herein as an example.

In the embodiment, the second device substrate 200 may be a chip comprising a device region 210 and an electronic element (not shown) in the device region 210. Similarly, the electronic element in the device region 210 may be electrically connected to the second conducting pad 240 by an interconnection structure (as shown by a dotted line 260) in the second device substrate 200.

The third device substrate 300 may be attached to the second surface 200b of the second device substrate 200 by another adhesive layer (not shown). In one embodiment, the third device substrate 300 may be a silicon substrate or another semiconductor substrate. In the embodiment, the third device substrate 300 comprises one or more third conducting pads 340. The third conducting pads 340 may be adjacent to an upper surface of the third device substrate 300 (i.e., a surface opposite to the second surface 200b). Moreover, the third conducting pads 340 may have a similar structure to that of the first conducting pads 140. To simplify the diagram, only one third conducting pad 340 comprising a single conducting layer in the third device substrate 300 is depicted herein as an example.

In the embodiment, the third device substrate 300 may be a chip comprising a device region 310 and an electronic element (not shown) in the device region 310. Similarly, the electronic element in the device region 310 may be electrically connected to the third conducting pad 340 by an interconnection structure (as shown by a dotted line 360) in the third device substrate 300.

In the embodiment, the electronic elements in the device regions 110, 210 and 310 may be an integrated passive device (IPD), a magnetic device, a radio frequency (RF) device, an oscillator, a micro electro mechanical system (MEMS), a sensing device or another suitable electronic element.

In the embodiment, the size of the second device substrate 200 is greater than that of the third device substrate 300 and less than that of the first device substrate 100. Moreover, when the size of the second device substrate 200 is large enough, more than one third device substrate 300, each having different integrated circuit functions, can be disposed on the second surface 200b of the second device substrate 200. Furthermore, when the size of the first device substrate 100 is large enough, more than one second device substrate 200, each having different integrated circuit functions, can be disposed on the first device substrate 100.

The insulating layer 400 covers the first device substrate 100, the second device substrate 200, and the third device substrate 300 and has a plurality of openings 420 therein. In the embodiment, the openings 420 correspond to the first bonding pads 130. In the embodiment, the insulating layer 400 may comprise epoxy resin, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates) or another suitable insulating material.

The first bumps 370 are disposed under bottoms of the openings 420 in the insulating layer 400 and the openings 420 expose the first bumps 370. In the embodiment, the first bumps 370 are correspondingly disposed on the first bonding pads 130 in the first device substrate 100 and are electrically connected thereto. In the embodiment, the first bumps 370 are bonding balls. In other embodiments, the first bumps 370 may be conducting pillars or other suitable conducting structures. In the embodiment, the first bumps 370 may comprise gold or another suitable conducting material.

A plurality of conducting structures 380 is disposed in the insulating layer 400. One conducting structure 380 electrically connects one first conducting pad 140 in the first device substrate 100 to one second conducting pad 240 in the second device substrate 240. Another conducting structure 380 electrically connects another first conducting pad 140 in the first device substrate 100 to one third conducting pad 340 in the third device substrate 300. For example, one conducting structure 380 is disposed on the respective first conducting pad 140 and second conducting pad 240, such that the electronic elements in the device regions 110 and 210 are electrically connected to each other. Moreover, another conducting structure 380 is disposed on the respective first conducting pad 140 and third conducting pad 340, such that the electronic elements in the device regions 110 and 310 are electrically connected to each other. In the embodiment, the conducting structures 380 are formed of bonding balls disposed on the conducting pads and a wire extending between the bonding balls. Moreover, the conducting structures 380 may comprise gold or another suitable conducting material. In one embodiment, the material of the first bumps 370 is the same as that of the conducting structures 380.

The patterned redistribution layer 440 is disposed on the insulating layer 400 and fills the openings 420 in the insulating layer 400 so as to be electrically connected to the first bumps 370 under the bottoms of the openings 420 through the openings 420. In one embodiment, the redistribution layer 440 fully fills the opening 420 in the insulating layer 400. In other embodiments, the redistribution layer 440 may be conformally disposed on the sidewalls and bottom of the opening 420 without fully filling the opening 420 in the insulating layer 400. In one embodiment, the redistribution layer 440 may comprise copper, aluminum, gold, platinum, nickel, tin, a combination thereof or another suitable conducting material.

A passivation layer 460 is disposed on the redistribution layer 440 and the insulating layer 400 and has a plurality of openings 480 exposing a portion of the redistribution layer 440 on the insulating layer 400. In the embodiment, the passivation layer 460 may comprise epoxy resin, solder mask, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates), photoresist materials or another suitable insulating material.

A plurality of second bumps 500 is correspondingly disposed in the openings 480 of the passivation layer 460. The second bumps 500 directly contact the exposed redistribution layer 440 and are electrically connected thereto. In the embodiment, the second bumps 500 may be arranged in an array (not shown) so as to provide stable bonding in the subsequent process. It should be realized that the positions of the conducting structure 380, the first bump 370 and the second bump 500 are determined by design requirements and they are not limited thereto.

In the embodiment, the second bump 500 is a bump, such as a bonding ball or a conducting pillar, or may be another suitable conducting structure. The second bump 500 may comprise tin, lead, copper, gold, nickel, a combination thereof or another suitable conducting material. For example, the second bump 500 may be a solder ball. In the embodiment, the first bump 370 and the second bump 500 are bonding balls and the size of the second bump 500 is greater than that of the first bump 370. In one embodiment, the material of the second bump 500 is different from that of the first bump 370.

Figure 2:
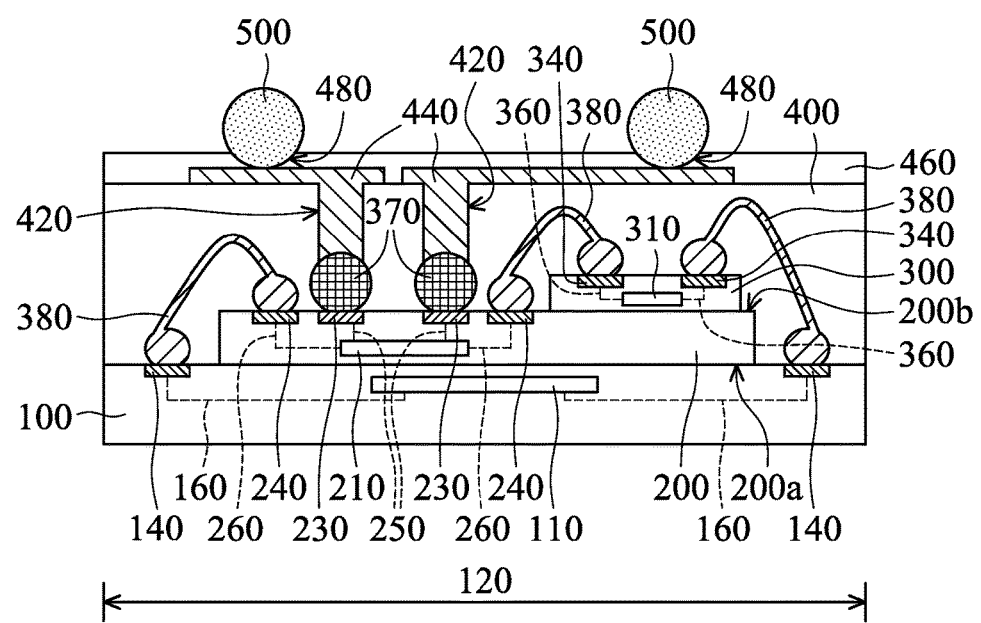
FIGS. 2 and 3 are cross-sectional views of different exemplary embodiments of a chip package according to the invention.
Figure 3:
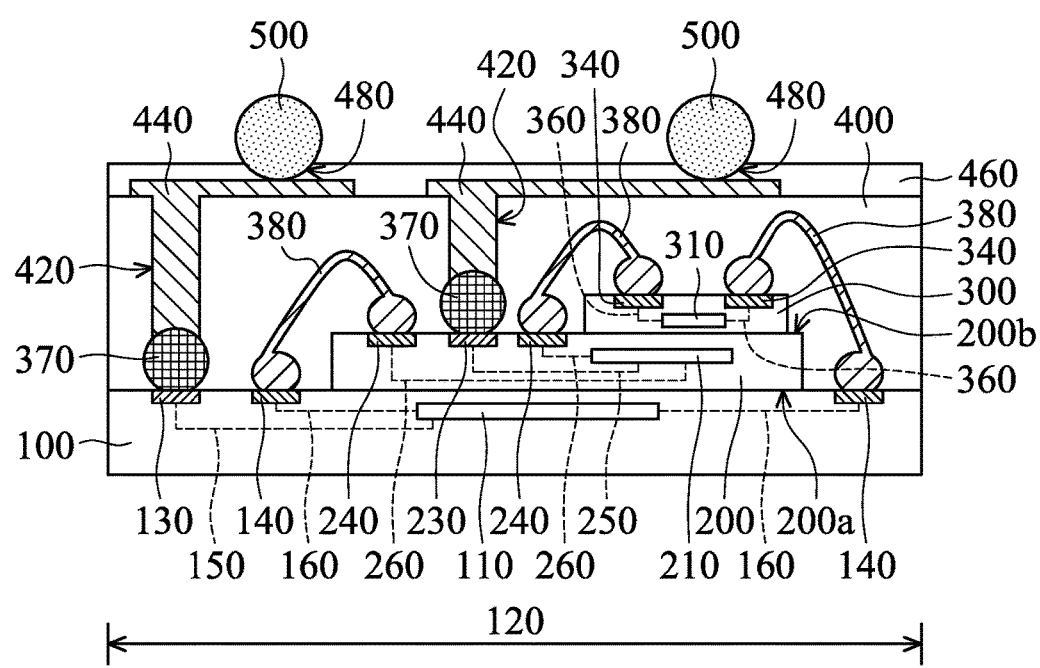

Cross-sectional views of different exemplary embodiments of a chip package according to the invention are illustrated in FIGS. 2 and 3, wherein elements in FIGS. 2 and 3 that are the same as those in FIG. 1E are labeled with the same reference numbers as in FIG. 1E and are not described again for brevity. The chip package structure shown in FIG. 2 is similar to that shown in FIG. 1E. The difference therebetween is that the first device substrate 100 shown in FIG. 2 does not comprise the first bonding pads 130 shown in FIG. 1E and the second device substrate 200 shown in FIG. 2 comprises two second bonding pads 230 and two second conducting pads 240. The second bonding pads 230 and the second conducting pads 240 may be electrically connected to the electronic element in the device region 210 by interconnection structures (as shown by dotted lines 250 and 260) in the second device substrate 200. Moreover, the two first bumps 370 shown in FIG. 2 are correspondingly disposed on the two second bonding pads 230 and are electrically connected thereto.

The third device substrate 300 shown in FIG. 2 comprises two third conducting pads 340. The third conducting pads 340 may be electrically connected to the electronic element in the device region 310 by an interconnection structure (as shown by a dotted line 360) in the third device substrate 300. Moreover, there are three conducting structures 380 in the insulating layer 400 shown in FIG. 2. These conducting structures 380 electrically connect one first conducting pad 140 in the first device substrate 100 to one second conducting pad 240 in the second device substrate 200, electrically connect another first conducting pad 140 in the first device substrate 100 to one third conducting pad 340 in the third device substrate 300, and electrically connect another second conducting pad 240 in the second device substrate 200 to another third conducting pad 340 in the third device substrate 300.

Furthermore, the chip package structure shown in FIG. 3 is similar to that shown in FIG. 2. The difference therebetween is that the first device substrate 100 shown in FIG. 3 comprises one first bonding pad 130. One first bump 370 is disposed on the first bonding pad 130 in the first device substrate 100 and is electrically connected thereto. Another first bump 370 is disposed on the second bonding pad 230 in the second device substrate 200 and is electrically connected thereto. It should be realized that the numbers and positions of the bonding pads, the conducting pads and the conducting structures are described herein as examples and they are not limited thereto.

According to the aforementioned embodiments, a plurality of different-sized device substrates/chips can be vertically stacked on one another so as to be integrated in the same chip package. As a result, a single chip package can have a variety of integrated circuit functions. Therefore, the size of the printed circuit board, which is subsequently bonded to the chip package, can be reduced thereby further decreasing the size of the electronic products made using the chip package.

An exemplary embodiment of a method for forming a chip package according to the invention is illustrated in FIGS. 1A to 1E, in which FIGS. 1A to 1E are cross-sectional views of an exemplary embodiment of a method for forming a chip package according to the invention.

Referring to FIG. 1A, a first device substrate 100 is provided. The first device substrate 100 comprises a plurality of chip regions. In one embodiment, the first device substrate 100 may be a silicon substrate or another semiconductor substrate. For example, the first device substrate 100 may be a silicon wafer so as to facilitate the wafer-level packaging process. In the embodiment, the first device substrate 100 in each chip region comprises one or more first bonding pads and one or more first conducting pads. The first bonding pads and the first conducting pads may be adjacent to an upper surface of the first device substrate 100. To simplify the diagram, only one chip region 120 of the first device substrate 100 and only two first bonding pads 130 and two first conducting pads 140 therein are depicted herein as an example. In the embodiment, the first bonding pad 130 and the first conducting pad 140 may be a single conducting layer or comprise multiple conducting layers, and only a single conducting layer is depicted herein as an example.

In the embodiment, the first device substrate 100 in each chip region 120 comprises a device region 110 and an electronic element (not shown) in the device region 110. In one embodiment, the electronic element in the device region 110 may be electrically connected to the first bonding pads 130 and the first conducting pads 140 by interconnection structures in the first device substrate 100. To simplify the diagram, only dotted lines 150 and 160 are depicted herein to respectively represent interconnection structures between the first bonding pad 130 and the device region 110 and between the first conducting pad 140 and the device region 110.

Next, a second device substrate 200 and a third device substrate 300 are provided on the first device substrate 100 in each chip region 120. For example, a first surface 200a of the second device substrate 200 may be attached to the upper surface of the first device substrate 100 by an adhesive layer (not shown). The third device substrate 300 may be attached to a second surface 200b of the second device substrate 200, which is opposite to the first surface 200a, by another adhesive layer (not shown).

In one embodiment, the second device substrate 200 may be a silicon substrate or another semiconductor substrate. In the embodiment, the second device substrate 200 comprises one or more second conducting pads 240. The second conducting pads 240 may be adjacent to the second surface 200b. Moreover, the second conducting pads 240 may have a similar structure to that of the first conducting pads 140. To simplify the diagram, only one second conducting pad 240 formed of a single conducting layer in the second device substrate 200 is depicted herein as an example.

In the embodiment, the second device substrate 200 comprises a device region 210 and an electronic element (not shown) in the device region 210. Similarly, the electronic element in the device region 210 may be electrically connected to the second conducting pad 240 by an interconnection structure (as shown by a dotted line 260) in the second device substrate 200.

In other embodiments, as shown in FIGS. 2 and 3, the second device substrate 200 may comprise one or more second bonding pads 230. The second bonding pads 230 may be electrically connected to the electronic element in the device region 210 by an interconnection structure (as shown by a dotted line 250) in the second device substrate 200.

In one embodiment, the third device substrate 300 may be a silicon substrate or another semiconductor substrate. In the embodiment, the third device substrate 300 comprises one or more third conducting pads 340. The third conducting pads 340 may be adjacent to an upper surface of the third device substrate 300 (i.e., a surface opposite to the second surface 200b). Moreover, the third conducting pads 340 may have a similar structure to that of the first conducting pads 140. To simplify the diagram, only one third conducting pad 340 comprising a single conducting layer in the third device substrate 300 is depicted herein as an example.

In the embodiment, the third device substrate 300 comprises a device region 310 and an electronic element (not shown) in the device region 310. Similarly, the electronic element in the device region 310 may be electrically connected to the third conducting pad 340 by an interconnection structure (as shown by a dotted line 360) in the third device substrate 300.

In the embodiment, the electronic elements in the device regions 110, 210 and 310 may be an integrated passive device, a magnetic device, a radio frequency device, an oscillator, a micro electro mechanical system, a sensing device or another suitable electronic element.

In the embodiment, the size of the second device substrate 200 is greater than that of the third device substrate 300 and less than that of the first device substrate 100. Moreover, when the size of the second device substrate 200 is large enough, more than one third device substrate 300, each having different integrated circuit functions, can be disposed on the second surface 200b of the second device substrate 200. Furthermore, when the size of the first device substrate 100 is large enough, more than one second device substrate 200, each having different integrated circuit functions, can be disposed on the first device substrate 100.

Referring to FIG. 1B, a plurality of first bumps 370 is formed on the respective first bonding pads 130 in the first device substrate 100 by a wire bonding process and is electrically connected to the respective first bonding pads 130. A plurality of conducting structures 380 is formed by a wire bonding process so as to electrically connect the second conducting pad 240 in the second device substrate 240 and the third conducting pad 340 in the third device substrate 300 to the respective first conducting pads 140 in the first device substrate 100. For example, one conducting structure 380 is formed on the respective first conducting pad 140 and second conducting pad 240, such that the electronic elements in the device regions 110 and 210 are electrically connected to each other. Moreover, another conducting structure 380 is formed on the respective first conducting pad 140 and third conducting pad 340, such that the electronic elements in the device regions 110 and 310 are electrically connected to each other. In one embodiment, the first bump 370 and the conducting structure 380 are formed in the same step by a wire bonding process. In other embodiments, the first bump 370 and the conducting structure 380 are separately formed in different steps by wire bonding processes.

In another embodiment, as shown in FIG. 2, two first bumps 370 may be formed on the respective second bonding pads 230 in the second device substrate 200 and are electrically connected thereto. In yet another embodiment, as shown in FIG. 3, one first bump 370 may be formed on the respective first bonding pad 130 in the first device substrate 100 and is electrically connected thereto. Another first bump 370 may be formed on the respective second bonding pad 230 in the second device substrate 200 and is electrically connected thereto.

In these embodiments shown in FIGS. 2 and 3, the third device substrate 300 comprises two third conducting pads 340. Three conducting structures 380 are formed on the first device substrate 100 and are electrically connect the first conducting pad 140 in the first device substrate 100, the second conducting pad 240 in the second device substrate 200 and the third conducting pad 340 in the third device substrate 300 to one another. For example, two conducting structures 380 electrically connect two third conducting pads 340 in the third device substrate 300 to the respective first conducting pad 140 in the first device substrate 100 and the respective second conducting pad 240 in the second device substrate 200. The other conducting structure 380 electrically connects another first conducting pad 140 in the first device substrate 100 to another second conducting pad 240 in the second device substrate 200. In other embodiments, the conducting structures 380 may be optionally formed according to design requirements and it is not limited thereto.

In the embodiment, the first bumps 370 are bonding balls. In other embodiments, the first bumps 370 may be conducting pillars or other suitable conducting structures. In the embodiment, the first bumps 370 may comprise gold or another suitable conducting material.

According to the embodiment, the first bump 370 is formed of a material that is able to be eutectic with the material of the bonding pad and directly bonded thereto, such as gold. Therefore, the first bump 370 can be directly formed on the bonding pad and a wire bonding process, rather than a reflow process, can be used to form the first bump 370. As a result, the fabrication process is simplified.

In the embodiment, the conducting structure 380 is formed of bonding balls disposed on the conducting pads and a wire extending between the bonding balls. Moreover, the conducting structure 380 may comprise gold or another suitable conducting material. In one embodiment, the material of the first bump 370 is the same as that of the conducting structure 380.

Referring to FIG. 1C, an insulating layer 400 may be formed on the first device substrate 100 by a molding process or a deposition process (such as a printing process, a coating process, a physical vapor deposition process, a chemical vapor deposition process or another suitable process) to cover the first device substrate 100, the second device substrate 200, and the third device substrate 300, such that the conducting structures 380 are located in the insulating layer 400. In the embodiment, the insulating layer 400 may comprise epoxy resin, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates) or another suitable insulating material.

Next, a plurality of openings 420 may be formed in the insulating layer 400 by a laser drilling process or lithography and etching processes (the etching process may comprise a dry etching process or a wet etching process). In the embodiment, the openings 420 correspond to the first bonding pads 130 in the first device substrate 100, such that the first bumps 370 are located under bottoms of the openings 420 in the insulating layer 400 and the openings 420 expose the first bumps 370.

In another embodiment, as shown in FIG. 2, the openings 420 correspond to the second bonding pads 230 in the second device substrate 200. In yet another embodiment, as shown in FIG. 3, the openings 420 may correspond to the respective first bonding pad 130 in the first device substrate 100 and the respective second bonding pad 230 in the second device substrate 200.

In these embodiments, the first bumps 370 on the first bonding pad 130 and the second bonding pad 230 can be buffer layers during the formation of the openings 420, such as during a laser drilling process. As a result, the first bonding pad 130 and the second bonding pad 230 are prevented from being damaged during the formation of the openings 420 thereby improving reliability or quality of the chip package. Moreover, since the first bumps 370 are formed on the first bonding pad 130 and the second bonding pad 230, the depth of the openings 420 is reduced. Therefore, the aspect ratio (AR) of the openings 420 can be reduced thereby facilitating the formation of the openings 420. In addition, when the openings 420 correspond to the second bonding pads 230 in the second device substrate 200, the depth of the openings 420 is reduced further.

Referring to FIG. 1D, a patterned redistribution layer 440 may be formed on the insulating layer 400 by a deposition process (such as a coating process, a chemical vapor deposition process, a physical vapor deposition process, an electroplating process, an electroless plating process or another suitable process) and lithography and etching processes. The redistribution layer 440 fills the openings 420 in the insulating layer 400 so as to be electrically connected to the first bumps 370 under the bottoms of the openings 420 through the openings 420. In one embodiment, the redistribution layer 440 fully fills the opening 420 in the insulating layer 400. In other embodiments, the redistribution layer 440 may be conformally formed on the sidewalls and bottom of the opening 420 without fully filling the opening 420 in the insulating layer 400. In one embodiment, the redistribution layer 440 may comprise copper, aluminum, gold, platinum, nickel, tin, a combination thereof or another suitable conducting material.

Next, a passivation layer 460 may be formed on the redistribution layer 440 and the insulating layer 400 by a deposition process (such as a coating process, a physical vapor deposition process, a chemical vapor deposition process or another suitable process). In the embodiment, the passivation layer 460 may comprise epoxy resin, solder mask, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates), photoresist materials or another suitable insulating material.

Referring to FIG. 1E, a plurality of openings 480 may be formed in the passivation layer 460 in each chip region 120 by lithography and etching processes to expose portions of the redistribution layer 440 on the insulating layer 400. When the passivation layer 460 comprises photoresist materials, the openings 480 may be formed by a lithography process. Next, a plurality of second bumps 500 is formed in the corresponding openings 480 of the passivation layer 460. The second bumps 500 directly contact the exposed redistribution layer 440 and are electrically connected to the redistribution layer 440. In the embodiment, the second bumps 500 may be arranged in an array (not shown) so as to provide stable bonding in the subsequent process. It should be realized that the positions of the conducting structure 380, the first bump 370 and the second bump 500 are determined by design requirements and they are not limited thereto.

In the embodiment, the second bump 500 is a bump, such as a bonding ball or a conducting pillar, or may be another suitable conducting structure. For example, solder may be formed in the openings 480 of the passivation layer 460 by a plating process, a screen printing process or another suitable process. A reflow process is then performed and solder balls are formed to be the second bumps 500. In the embodiment, the second bump 500 may comprise tin, lead, copper, gold, nickel, a combination thereof or another suitable conducting material.

In the embodiment, the first bump 370 and the second bump 500 are bonding balls and the size of the second bump 500 is greater than that of the first bump 370. In one embodiment, the material of the second bump 500 is different from that of the first bump 370. In one embodiment, the process for forming the second bump 500 is different from that of the first bump 370. For example, the second bump 500 is formed by a reflow process while the first bump 370 is formed by a wire bonding process.

Next, a dicing process is performed in the first device substrate 100 and the insulating layer 400 along scribe lines (not shown) between the adjacent chip regions 120 to form a plurality of independent chip packages. In the embodiment, a printed circuit board (not shown) may be further provided on the independent chip package and be electrically connected to the electronic element in the device region 110 of the first device substrate 100, the electronic element in the device region 210 of the second device substrate 200 and the electronic element in the device region 310 of the third device substrate 300 through the second bumps 500.

According to the aforementioned embodiments, a plurality of different-sized device substrates/chips can be vertically stacked on one another so as to be integrated in the same chip package. As a result, a single chip package can have a variety of integrated circuit functions. Therefore, the size of the printed circuit board, which is subsequently bonded to the chip package, can be reduced thereby further decreasing the size of electronic products. Moreover, the electronic elements in the device substrates are electrically connected to one another through wires (i.e., the conducting structures 380) and the external electrical connection path of the chip package is formed of the redistribution layer 440 in the openings 420 of the insulating layer 400 and the first bumps 370. As a result, there is no need to form through silicon vias (TSV) in the device substrates. Therefore, the fabrication process is simplified and the cost is lowered. In addition, forming chip packages by wafer-level packaging can produce massive chip packages, thereby significantly reducing the processing cost and time.

Another exemplary embodiment of a method for forming a chip package according to the invention is illustrated in FIGS. 4A to 4F, in which FIGS. 4A to 4F are cross-sectional views of another exemplary embodiment of a method for forming a chip package according to the invention. Elements in FIGS. 4A to 4F that are the same as those in FIGS. 1A to 1E are labeled with the same reference numbers as in FIGS. 1A to 1E and are not described again for brevity.

Figure 4A:
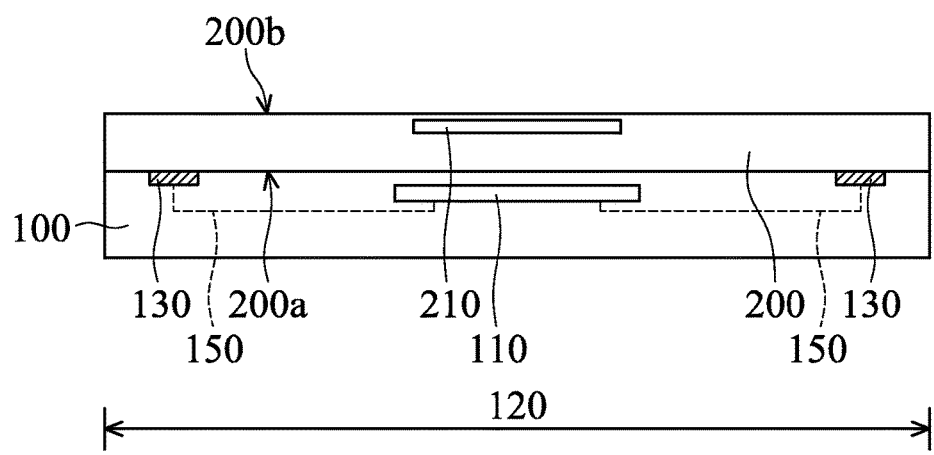
FIGS. 4A to 4F are cross-sectional views of another exemplary embodiment of a method for forming a chip package according to the invention.

Referring to FIG. 4A, a first device substrate 100 and a second device substrate 200, which are vertically stacked, are provided. In the embodiment, a first surface 200a of the second device substrate 200 is attached to an upper surface of the first device substrate 100. In one embodiment, a bonding ring (not shown) may be formed between the first device substrate 100 and the second device substrate 200 in each chip region 120. An interconnection structure (not shown) may be formed in the bonding ring. A device region 110 in the first device substrate 100 and a device region 210 in the second device substrate 200 may be electrically connected to each other through the interconnection structure in the bonding ring. In one embodiment, the device region 110 in the first device substrate 100 may comprise an application-specific integrated circuit (ASIC) element or another suitable electronic element. Moreover, the device region 210 in the second device substrate 200 may comprise a micro electro mechanical system or another suitable electronic element.

Figure 4B:
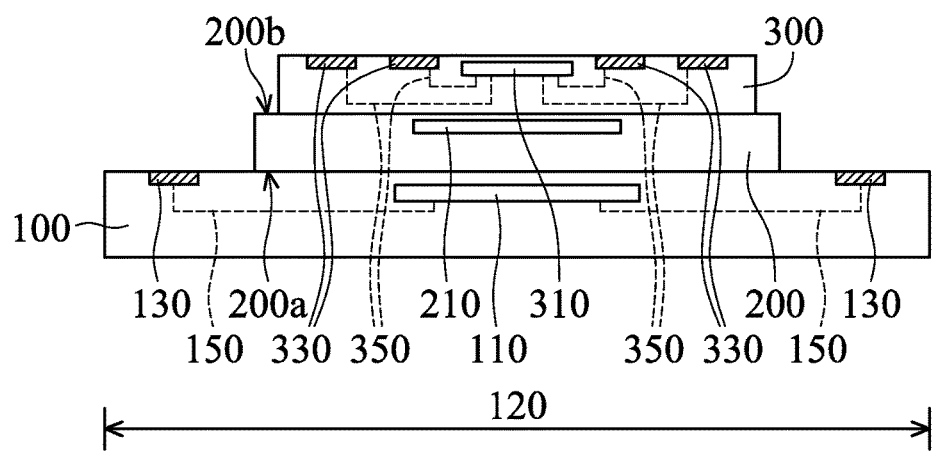

Referring to FIG. 4B, a dicing process is performed in the second device substrate 200 to expose first bonding pads 130 in the first device substrate 100. For example, the first device substrate 100 and the second device substrate 200 are semiconductor wafers, and chip regions of the second device substrate 200 correspond to the chip regions 120 of the first device substrate 100. The dicing process is performed along scribe lines (not shown) between the chip regions of the second device substrate 200. Portions of the second device substrate 200, which cover the first bonding pads 130, are removed to expose the underlying first bonding pads 130. As a result, the second device substrate 200 is separated into a plurality of chips corresponding to the chip regions 120. In one embodiment, the separated chip still covers the bonding ring (not shown) between the first device substrate 100 and the second device substrate 200.

In other embodiments, the second device substrate 200 may have been previously separated into a plurality of chips. Then, these chips are bonded onto the first device substrate 100 and correspond to the chip regions 120.

Next, a third device substrate 300 is provided on the second device substrate 200 in each chip region 120. For example, the third device substrate 300 may be attached to a second surface 200b of the second device substrate 200, which is opposite to the first surface 200a, by an adhesive layer (not shown). In the embodiment, the third device substrate 300 comprises one or more third bonding pads 330. The third bonding pads 330 may be adjacent to an upper surface of the third device substrate 300 (i.e., a surface opposite to the second surface 200b). Similarly, the third bonding pad 330 may be a single conducting layer or comprise multiple conducting layers. To simplify the diagram, only four third bonding pads 330 comprising a single conducting layer are depicted herein as an example. In the embodiment, the electronic element (not shown) in a device region 310 of the third device substrate 300 may be electrically connected to the third bonding pads 330 by interconnection structures (as shown by dotted lines 350) in the third device substrate 300.

Figure 4C:
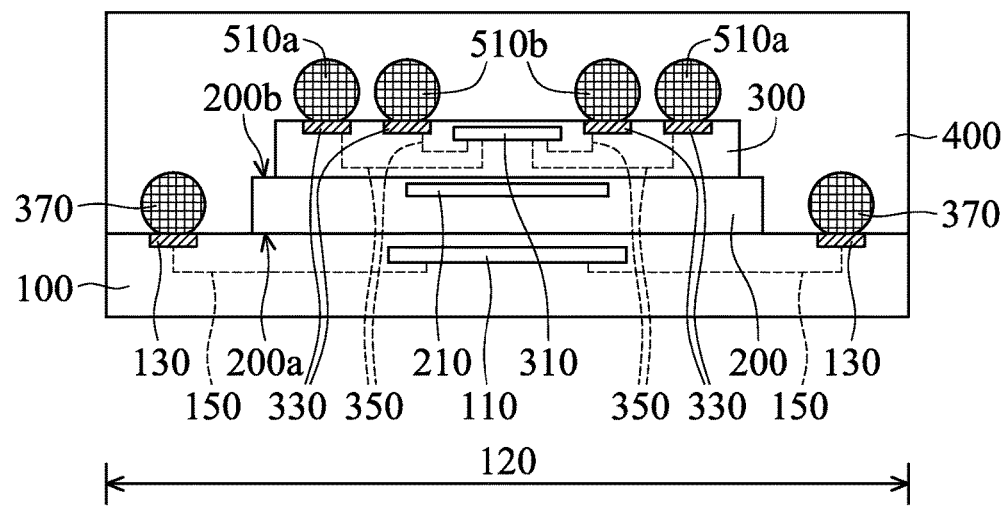

Referring to FIG. 4C, a plurality of first bumps 370 is formed on the respective first bonding pads 130 in the first device substrate 100 by a wire bonding process and is electrically connected to the respective first bonding pads 130. Moreover, a plurality of third bumps 510a and a plurality of fourth bumps 510b are formed on the respective third bonding pads 330 in the third device substrate 300 by a wire bonding process and are electrically connected to the respective third bonding pads 330. In the embodiment, the third bumps 510a and the fourth bumps 510b are bonding balls. In other embodiments, the third bumps 510a and the fourth bumps 510b may be conducting pillars or other suitable conducting structures. In the embodiment, the third bumps 510a and the fourth bumps 510b may comprise gold or another suitable conducting material. Moreover, the material of the third bumps 510a and the fourth bumps 510b is the same as that of the first bumps 370.

Next, an insulating layer 400 may be formed on the first device substrate 100 by a molding process or a deposition process (such as a printing process, a coating process, a physical vapor deposition process, a chemical vapor deposition process or another suitable process) to cover the first device substrate 100, the second device substrate 200, the third device substrate 300, the first bumps 370, the third bumps 510a and the fourth bumps 510b.

Figure 4D:
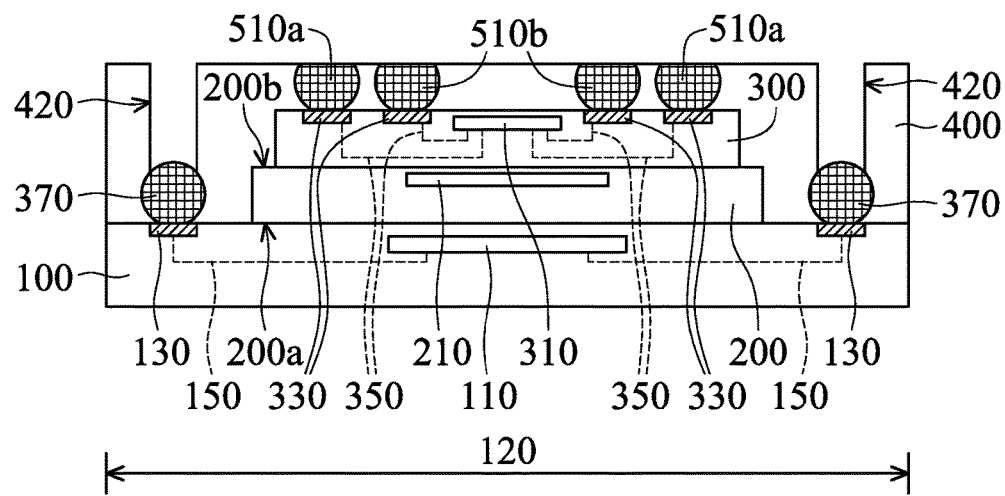

Referring to FIG. 4D, a mechanical grinding process or a chemical mechanical polishing process is performed on the insulating layer 400 to reduce the thickness of the insulating layer 400 and expose the third bumps 510a and the fourth bumps 510b. In the embodiment, top portions of the third bumps 510a and the fourth bumps 510b are partially removed by the grinding or polishing process. As a result, the third bumps 510a and the fourth bumps 510b have a flat upper surface and the size of the third bumps 510a and the fourth bumps 510b is less than that of the first bumps 370.

Next, a plurality of openings 420 may be formed in the insulating layer 400 by a laser drilling process or lithography and etching processes. In the embodiment, the openings 420 correspond to the first bonding pads 130 in the first device substrate 100, such that the first bumps 370 are located under the bottoms of the openings 420 in the insulating layer 400 and each opening 420 exposes a portion of the first bump 370.

In the embodiment, the thickness of the insulating layer 400 is reduced by the grinding or polishing process, such that the depth of the openings 420 is reduced. Therefore, the aspect ratio of the openings 420 can be reduced thereby facilitating the formation of the openings 420.

Figure 4E:
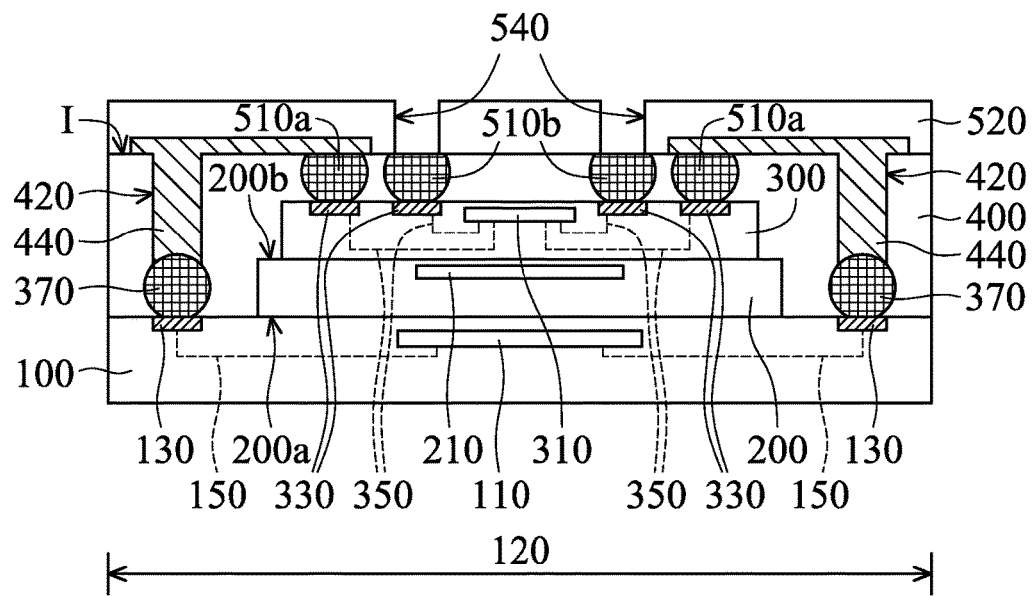

Referring to FIG. 4E, a patterned redistribution layer 440 may be formed on the insulating layer 400 by a deposition process (such as a coating process, a chemical vapor deposition process, a physical vapor deposition process, an electroplating process, an electroless plating process or another suitable process) and lithography and etching processes. The redistribution layer 440 fills the openings 420 in the insulating layer 400 so as to be electrically connected to the first bumps 370 under the bottoms of the openings 420 through the openings 420. In the embodiment, the redistribution layer 440 on the insulating layer 400 extends to at least cover a portion of the third bumps 510a and be electrically connected thereto.

Next, an another insulating layer 520 may be formed on the insulating layer 400 by a molding process or a deposition process (such as a printing process, a coating process, a physical vapor deposition process, a chemical vapor deposition process or another suitable process) to cover the redistribution layer 440, the third bumps 510a and the fourth bumps 510b. In the embodiment, the insulating layer 520 may comprise epoxy resin, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates) or another suitable insulating material. In one embodiment, the material of the insulating layer 520 is different from that of the insulating layer 400, such that there is a visible interface I between the insulating layer 520 and the insulating layer 400. In other embodiments, the material of the insulating layer 520 may be the same as that of the insulating layer 400.

Next, a plurality of openings 540 may be formed in the insulating layer 520 by a laser drilling process or lithography and etching processes. In the embodiment, the openings 540 correspond to the third bonding pads 330 in the third device substrate 300, which do not contact the redistribution layer 440. Namely, the openings 540 correspond to the fourth bumps 510b, such that the fourth bumps 510b are located under the bottoms of the openings 540 in the insulating layer 520 and each opening 540 exposes a portion of the fourth bump 510b. In the embodiment, the depth of the openings 540 is less than that of the openings 420.

In the embodiment, the fourth bump 510b can be a buffer layer during the formation of the openings 540, such as during a laser drilling process so as to prevent the third bonding pad 330 from being damaged by the process. Moreover, since the fourth bump 510b is formed on the third bonding pad 330, the depth of the openings 540 is reduced. Therefore, the aspect ratio of the openings 540 can be reduced.

Figure 4F:
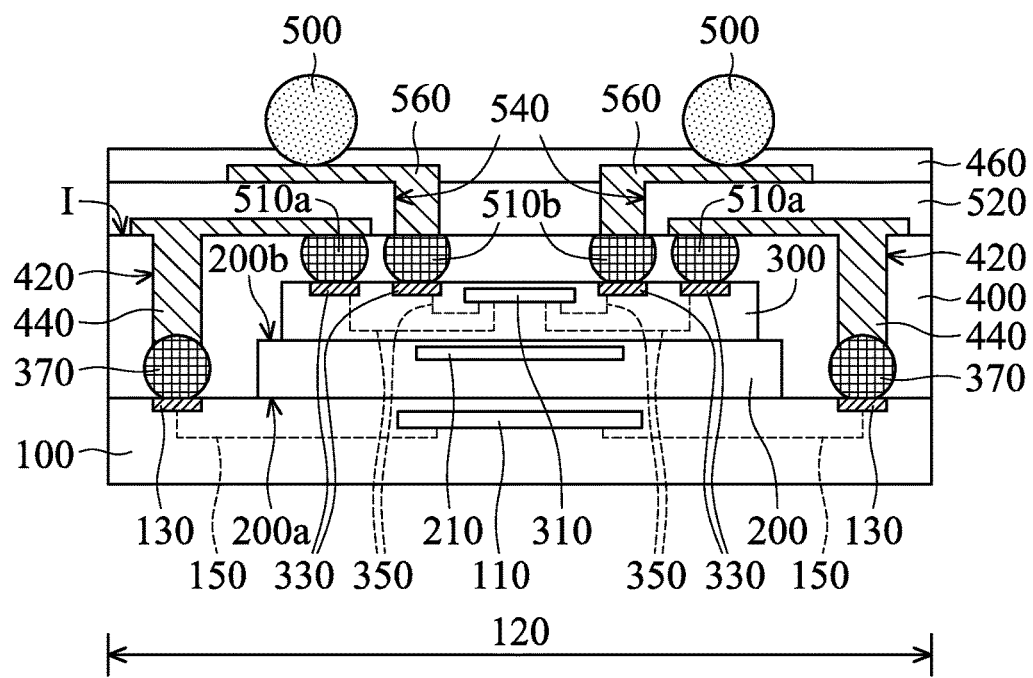

Referring to FIG. 4F, another patterned redistribution layer 560 may be formed on the insulating layer 520 by a deposition process and lithography and etching processes. The redistribution layer 560 fills the openings 540 in the insulating layer 520 so as to be electrically connected to the fourth bump 510b under the bottoms of the openings 540 through the openings 540. In one embodiment, the redistribution layer 560 fully fills the opening 540 in the insulating layer 520. In other embodiments, the redistribution layer 560 may be conformally disposed on the sidewalls and bottom of the opening 540 without fully filling the opening 540. In one embodiment, the redistribution layer 560 may comprise copper, aluminum, gold, platinum, nickel, tin, a combination thereof or another suitable conducting material.

A passivation layer 460 may be formed on the redistribution layer 560 and the insulating layer 520 by a deposition process (such as a coating process, a physical vapor deposition process, a chemical vapor deposition process or another suitable process). A plurality of openings 480 may be formed in the passivation layer 460 in each chip region 120 by lithography and etching processes to expose portions of the redistribution layer 560 on the insulating layer 520.

Next, a plurality of second bumps 500 is formed in the corresponding openings 480 of the passivation layer 460. The second bumps 500 directly contact the exposed redistribution layer 560 and are electrically connected to the redistribution layer 560. In the embodiment, the second bumps 500, the third bumps 510a and the fourth bumps 510b are bonding balls. The size of the second bumps 500 is greater than that of the third bumps 510a and the fourth bumps 510b. In one embodiment, the material of the second bumps 500 is different from that of the third bumps 510a and the fourth bumps. In one embodiment, the process for forming the second bumps 500 is different from that of the third bumps 510a and the fourth bumps. For example, the second bump 500 is formed by a reflow process while the third bumps 510a and the fourth bumps are formed by a wire bonding process.

Next, a dicing process is performed in the first device substrate 100 and the insulating layers 400 and 520 along scribe lines (not shown) between the adjacent chip regions 120 to form a plurality of independent chip packages.

When more second or third device substrates are bonded onto the first device substrate, more wires used to electrically connect the electronic elements in the device substrates to one another are formed. As a result, the processing cost and time are significantly increased. Moreover, forming too many wires on the device substrates would make it difficult for the subsequently formed insulating layer(s) to cover the device substrates successfully.

In the embodiment shown in FIGS. 4A to 4F, the electronic elements of the device substrates in the chip region 120 can be simultaneously electrically connected to one another through the first and third bumps 370 and 510a and the redistribution layer 440 in the same process, instead of using wires. Therefore, the processing cost and time are significantly reduced. It also facilitates the formation of the insulating layer 400 and thereby reduces the processing difficulty and improves the reliability of the chip package.

Figure 5:
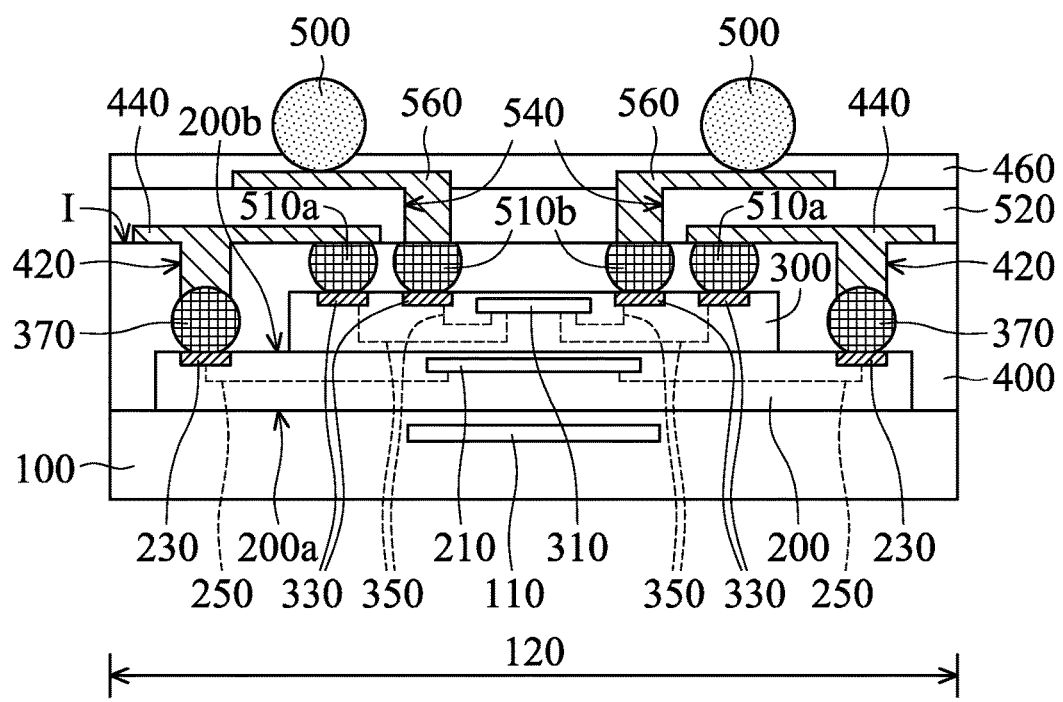
FIGS. 5 to 8 are cross-sectional views of other exemplary embodiments of a chip package according to the invention.

Cross-sectional views of other exemplary embodiments of a chip package according to the invention are illustrated in FIGS. 5 to 8, wherein elements in FIGS. 5 to 8 that are the same as those in FIGS. 1A to 1E and FIGS. 4A to 4F are labeled with the same reference numbers as in FIGS. 1A to 1E and FIGS. 4A to 4F and are not described again for brevity. The chip package structure shown in FIG. 5 is similar to that shown in FIG. 4F. The difference therebetween is that the first bumps 370 shown in FIG. 5 are formed on the second bonding pads 230 in the second device substrate 200, rather than being formed on the first bonding pads 130 in the first device substrate 100. Therefore, the depth of the openings 420 in the insulating layer 400 is decreased thereby reducing the aspect ratio of the openings 420.

Figure 6:
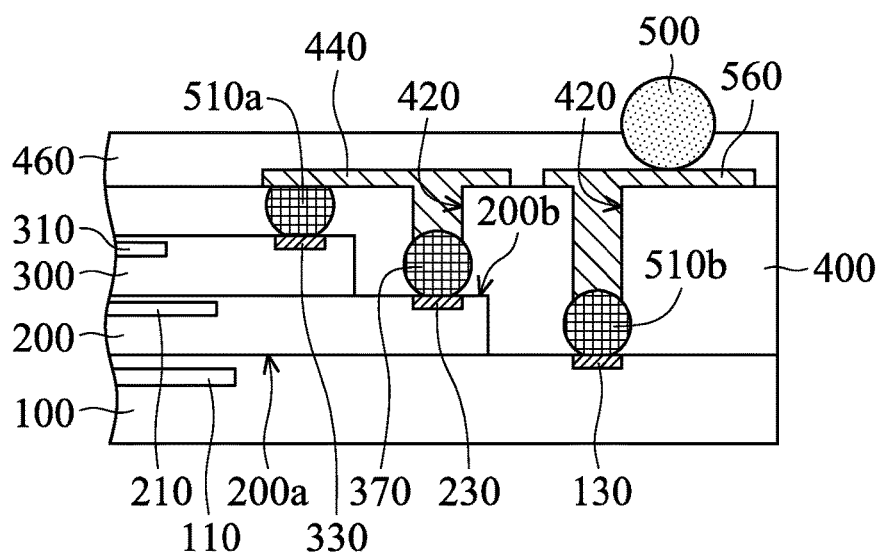

The chip package structure shown in FIG. 6 is similar to that shown in FIG. 5. The difference therebetween is that the fourth bump 510b shown in FIG. 6 is formed on the first bonding pad 130 in the first device substrate 100, rather than being formed on the third bonding pad 330 in the third device substrate 300. Moreover, another opening 420 is formed in the insulating layer 400 to expose the fourth bump 510b. The redistribution layer 560 is formed in the opening 420 and extends on the insulating layer 400, such that the second bump 500 is electrically connected to the fourth bump 510b located on the first device substrate 100 through the redistribution layer 560 in the opening 420. As a result, the insulating layer 520 (as shown in FIG. 5) can be omitted and the fabrication process is simplified.

Figure 7:
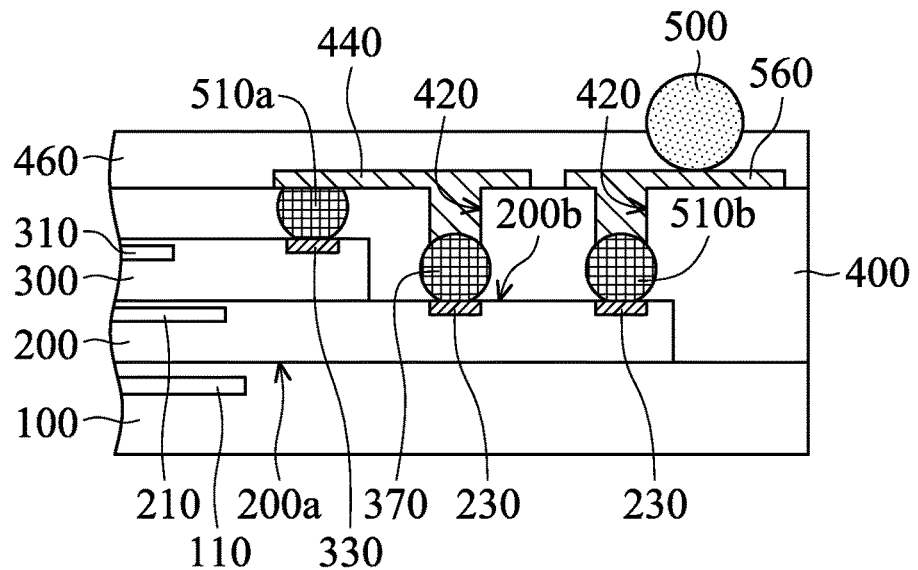

The chip package structure shown in FIG. 7 is similar to that shown in FIG. 6. The difference therebetween is that the fourth bump 510b shown in FIG. 7 is formed on the second bonding pad 230 in the second device substrate 200, rather than being formed on the first bonding pad 130 in the first device substrate 100. Therefore, the depth of the openings 420 exposing the fourth bump 510b is decreased thereby reducing its aspect ratio. Moreover, the openings 420 exposing the first bump 370 and the fourth bump 510b can be simultaneously formed and the redistribution layers 440 and 560 can also be simultaneously formed in the same process. Accordingly, the fabrication process is simplified even further.

However, in other embodiments, when the fourth bump 510b is formed on the second bonding pad 230, the first bump 370 shown in FIG. 7 may be formed on the first bonding pad 130 in the first device substrate 100.

Figure 8:
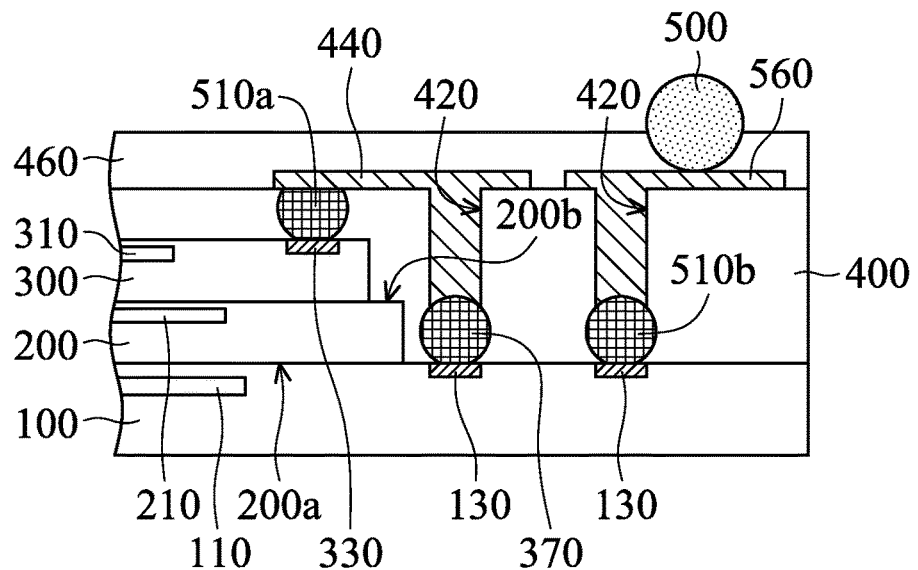

The chip package structure shown in FIG. 8 is similar to that shown in FIG. 7. The difference therebetween is that the first bump 370 and the fourth bump 510b shown in FIG. 8 are formed on the first bonding pads 130 in the first device substrate 100, rather than being formed on the second bonding pads 230 in the second device substrate 200. Therefore, the openings 420 exposing the first bump 370 and the fourth bump 510b can be simultaneously formed in the same process. The redistribution layers 440 and 560 can also be simultaneously formed in the same process.

It should be realized that the positions of the first bump 370, the second bump 500, the third bump 510a and the fourth bump 510b shown in FIGS. 4F and 5 to 8 are determined by design requirements and they are not limited thereto.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
  a first device substrate attached to a first surface of a second device substrate;
  a third device substrate attached to a second surface of the second device substrate opposite to the first surface;
  an insulating layer covering the first, second and third device substrates and having at least one opening therein;
  at least one first bump disposed under a bottom of the at least one opening;
  a redistribution layer disposed on the insulating layer and electrically connected to the at least one first bump through the at least one opening; and
  a third bump surrounded by the insulating layer, wherein the redistribution layer continuously extends on the third bump and into the at least one opening, wherein the third bump is located on the third device substrate and electrically connected to a third bonding pad in the third device substrate, and the third bump is a bonding ball and has a flat upper surface, and wherein the redistribution layer on the insulating layer covers the third bump and is electrically connected thereto.

2. The chip package as claimed in claim 1, wherein a size of the second device substrate is greater than that of the third device substrate and less than that of the first device substrate.

3. The chip package as claimed in claim 1, wherein the at least one first bump is located on the first device substrate and is electrically connected to a first bonding pad in the first device substrate.

4. The chip package as claimed in claim 1, wherein the at least one first bump is located on the second device substrate and is electrically connected to a second bonding pad in the second device substrate.

5. The chip package as claimed in claim 1, comprising a plurality of first bumps and a plurality of openings in the insulating layer, wherein the plurality of first bumps is correspondingly disposed under bottoms of the openings, and wherein one of the plurality of first bumps is located on the first device substrate and is electrically connected to a first bonding pad in the first device substrate, and an another one of the plurality of first bumps is located on the second device substrate and is electrically connected to a second bonding pad in the second device substrate.

6. The chip package as claimed in claim 1, further comprising a plurality of conducting structures disposed in the insulating layer, wherein the plurality of conducting structures electrically connect a first conducting pad in the first device substrate to a second conducting pad in the second device substrate and electrically connect an another first conducting pad in the first device substrate to a third conducting pad in the third device substrate.

7. The chip package as claimed in claim 1, further comprising a plurality of conducting structures disposed in the insulating layer, wherein the plurality of conducting structures electrically connect a first conducting pad in the first device substrate to a second conducting pad in the second device substrate, electrically connect an another first conducting pad in the first device substrate to a third conducting pad in the third device substrate, and electrically connect an another second conducting pad in the second device substrate to an another third conducting pad in the third device substrate.

8. The chip package as claimed in claim 1, further comprising a second bump located on the redistribution layer on the insulating layer.

9. The chip package as claimed in claim 8, wherein a material of the second bump is different from that of the at least one first bump.

10. The chip package as claimed in claim 8, wherein the at least one first bump and the second bump are bonding balls, and a size of the second bump is greater than that of the at least one first bump.

11. The chip package as claimed in claim 1, further comprising:
  a fourth bump disposed between the first device substrate and the redistribution layer; and
  an another redistribution layer disposed on the insulating layer and electrically connected to the fourth bump.

12. The chip package as claimed in claim 11, further comprising a second bump located on the another redistribution layer, wherein a material of the second bump is different from that of the third bump, the fourth bump and the at least one first bump.

13. The chip package as claimed in claim 11, further comprising a second bump located on the another redistribution layer, wherein the second, third and fourth bumps are bonding balls, and a size of the second bump is greater than that of the third and fourth bumps.

14. The chip package as claimed in claim 11, wherein the fourth bump is located on the third device substrate and is electrically connected to an another third bonding pad in the third device substrate, and wherein the chip package further comprises an another insulating layer covering the insulating layer and the redistribution layer and having an opening exposing the fourth bump, and the another redistribution layer is electrically connected to the fourth bump through the opening in the another insulating layer.

15. The chip package as claimed in claim 14, wherein the fourth bump is a bonding ball and has a flat upper surface.

16. The chip package as claimed in claim 11, wherein the fourth bump is electrically connected a first conducting pad in the first device substrate or a second conducting pad in the second device substrate, and wherein the insulating layer has a plurality of openings, and the another redistribution layer is electrically connected to the fourth bump through one of the plurality of openings which exposes the fourth bump.

17. A method for forming a chip package, comprising:
attaching a first device substrate to a first surface of a second device substrate;
attaching a third device substrate to a second surface of the second device substrate opposite to the first surface;
forming at least one first bump and an insulating layer, wherein the insulating layer covers the first, second and third device substrates and has at least one opening therein, such that the at least one first bump is formed under a bottom of the at least one opening;
forming a redistribution layer on the insulating layer, wherein the redistribution layer is electrically connected to the at least one first bump through the at least one opening; and
forming a third bump surrounded by the insulating layer, wherein the redistribution layer continuously extends on the third bump and into the at least one opening, wherein the third bump is located on the third device substrate and electrically connected to a third bonding pad in the third device substrate, and the third bump is a bonding ball and has a flat upper surface, and wherein the redistribution layer on the insulating layer covers the third bump and is electrically connected thereto.

18. The method as claimed in claim 17, wherein a size of the second device substrate is greater than that of the third device substrate and less than that of the first device substrate.

19. The method as claimed in claim 17, wherein the at least one first bump is located on the first device substrate and is electrically connected to a first bonding pad in the first device substrate.

20. The method as claimed in claim 17, wherein the at least one first bump is located on the second device substrate and is electrically connected to a second bonding pad in the second device substrate.

21. The method as claimed in claim 17, comprising forming a plurality of first bumps, wherein the insulating layer has a plurality of openings therein, such that the plurality of first bumps is correspondingly formed under bottoms of the openings, and wherein one of the plurality of first bumps is located on the first device substrate and is electrically connected to a first bonding pad in the first device substrate, and an another one of the plurality of first bumps is located on the second device substrate and is electrically connected to a second bonding pad in the second device substrate.

22. The method as claimed in claim 17, further comprising forming a plurality of conducting structures in the insulating layer so as to electrically connect a first conducting pad in the first device substrate to a second conducting pad in the second device substrate and to electrically connect an another first conducting pad in the first device substrate to a third conducting pad in the third device substrate.

23. The method as claimed in claim 17, further comprising forming a plurality of conducting structures disposed in the insulating layer so as to electrically connect a first conducting pad in the first device substrate to a second conducting pad in the second device substrate, to electrically connect an another first conducting pad in the first device substrate to a third conducting pad in the third device substrate, and to electrically connect an another second conducting pad in the second device substrate to an another third conducting pad in the third device substrate.

24. The method as claimed in claim 17, further comprising forming a second bump, wherein the second bump is located on the redistribution layer on the insulating layer.

25. The method as claimed in claim 24, wherein a material of the second bump is different from that of the at least one first bump.

26. The method as claimed in claim 24, wherein the at least one first bump and the second bump are bonding balls, and a size of the second bump is greater than that of the at least one first bump.

27. The method as claimed in claim 24, wherein a process for forming the second bump is different from that of the at least one first bump.

28. The method as claimed in claim 17, further comprising:
forming a fourth bump between the first device substrate and the redistribution layer; and
forming an another redistribution layer on the insulating layer and electrically connected to the fourth bump.

29. The method as claimed in claim 28, further comprising forming a second bump on the another redistribution layer, wherein a process for forming the second bump is different from that of the third and fourth bumps.

30. The method as claimed in claim 28, wherein the fourth bump is located on the third device substrate and is electrically connected to an another third bonding pad in the third device substrate, and wherein the method further comprises forming an another insulating layer to cover the insulating layer and the redistribution layer, and the another redistribution layer is electrically connected to the fourth bump through an opening in the another insulating layer which exposes the fourth bump.

31. The method as claimed in claim 28, wherein the fourth bump is electrically connected a first conducting pad in the first device substrate or a second conducting pad in the second device substrate, and wherein the insulating layer has a plurality of openings, and the another redistribution layer is electrically connected to the fourth bump through one of the plurality of openings which exposes the fourth bump.

32. The chip package as claimed in claim 17, wherein a portion of the insulating layer is removed to form the at least one opening, and a width of the portion is less than a width of the at least one first bump.

33. The chip package as claimed in claim 17, wherein the insulating layer covers the third bump and the at least one first bump, which does not overlap the third bump, before the formation of the at least one opening.

34. The chip package as claimed in claim 1, wherein the redistribution layer is in direct contact with the at least one first bump and/or the third bump.

35. The chip package as claimed in claim 1, wherein a bottom surface of the redistribution layer in the at least one opening is non-parallel to a top surface of the insulating layer.

* * * * *